(12) United States Patent
Kim

(10) Patent No.: US 12,453,220 B2
(45) Date of Patent: Oct. 21, 2025

(54) LIGHT EMITTING DIODE WITH CONDUCTIVE ENCAPSULATION AND METHOD OF MAKING THEREOF

(71) Applicant: SAMSUNG ELECTRONICS CO., LTD., Suwon-si (KR)

(72) Inventor: Brian Kim, Santa Clara, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 596 days.

(21) Appl. No.: 17/818,097

(22) Filed: Aug. 8, 2022

(65) Prior Publication Data
US 2023/0066558 A1   Mar. 2, 2023

Related U.S. Application Data

(60) Provisional application No. 63/238,959, filed on Aug. 31, 2021.

(51) Int. Cl.
*H10H 20/854* (2025.01)
*H10H 20/01* (2025.01)
*H10H 20/814* (2025.01)
*H10H 29/14* (2025.01)

(52) U.S. Cl.
CPC .......... *H10H 20/854* (2025.01); *H10H 20/01* (2025.01); *H10H 20/814* (2025.01); *H10H 29/142* (2025.01); *H10H 20/0362* (2025.01)

(58) Field of Classification Search
CPC .... H10H 20/854; H10H 20/01; H10H 20/814; H10H 29/142; H10H 20/0362; H10H 20/032; H10H 20/0363; H10H 20/833; H10H 20/856; H10H 20/835; H01L 25/0753

See application file for complete search history.

(56) References Cited

U.S. PATENT DOCUMENTS

| | | | |
|---|---|---|---|
| 10,553,767 B2 | 2/2020 | Danesh et al. | |
| 10,998,465 B2 | 5/2021 | Danesh et al. | |
| 11,239,212 B2 | 2/2022 | Kim | |
| 2016/0181476 A1* | 6/2016 | Chang ............. | H01L 24/95 257/13 |
| 2017/0162553 A1* | 6/2017 | Bibl .............. | G02F 1/133617 |
| 2018/0198047 A1 | 7/2018 | Danesh et al. | |
| 2018/0351017 A1* | 12/2018 | Schneider, Jr. ...... | H10H 20/812 |
| 2019/0115333 A1* | 4/2019 | Wu ............... | H01L 25/0753 |
| 2020/0066687 A1 | 2/2020 | Kim | |
| 2020/0075803 A1 | 3/2020 | Danesh et al. | |
| 2020/0381411 A1* | 12/2020 | Van Den Hoek ... | H01L 25/0753 |

OTHER PUBLICATIONS

Yirka, B., "3M teams with Cambrios to produce silver nanowire ink for touch displays," https://phys.org/news/2013-12-3m-teams-cambrios-silver-nanowire.html (Dec. 24, 2013).

* cited by examiner

*Primary Examiner* — Ratisha Mehta
*Assistant Examiner* — Sophia W Kao
(74) *Attorney, Agent, or Firm* — Sughrue Mion, PLLC

(57) ABSTRACT

A light emitting device includes a backplane, an array of light emitting diodes attached to a front side of the backplane, such that each of the light emitting diodes includes a stack of a first doped semiconductor layer, a second doped semiconductor layer and an active region located between the first and the second doped semiconductor layers, and a conductive encapsulation layer in contact with sidewalls of the first doped semiconductor layers of the array of light emitting diodes.

20 Claims, 12 Drawing Sheets

LIGHT EMITTING DIODE WITH CONDUCTIVE ENCAPSULATION AND METHOD OF MAKING THEREOF

FIELD

The present invention relates to light emitting devices, and particularly to light emitting diodes with conductive encapsulation and methods of fabricating the same.

BACKGROUND

Light emitting devices such as light emitting diodes (LEDs) are used in electronic displays, such as backlights in liquid crystal displays located in laptops or televisions, LED billboards, microdisplays, and LED televisions. A microLED refers to a light emitting diode having lateral dimensions that do not exceed 1 mm. A microLED has a typical lateral dimension in a range from 1 microns to 150 microns. An array of microLEDs can form an individual pixel element. A direct view display device can include an array of pixel elements, each of which includes several microLEDs which emit light having a different emission spectrum.

SUMMARY

According to an aspect of the present disclosure, a light emitting device includes a backplane, an array of light emitting diodes attached to a front side of the backplane, where each of the light emitting diodes includes a stack of a first doped semiconductor layer, a second doped semiconductor layer and an active region located between the first and the second doped semiconductor layers, and a conductive encapsulation layer in contact with sidewalls of the first doped semiconductor layers of the array of light emitting diodes.

According to another aspect of the present disclosure, a method of forming a light emitting device comprises attaching an array of light emitting diodes to a front side of a backplane, forming a dielectric matrix layer on the front side of the backplane and around the array of light emitting diodes, wherein sidewalls of light emitting diodes within the array of light emitting diodes are physically exposed, and forming a conductive encapsulation layer over the dielectric matrix layer and directly on sidewalls of the light emitting diodes within the array of light emitting diodes.

DETAILED DESCRIPTION

Figure 1A:
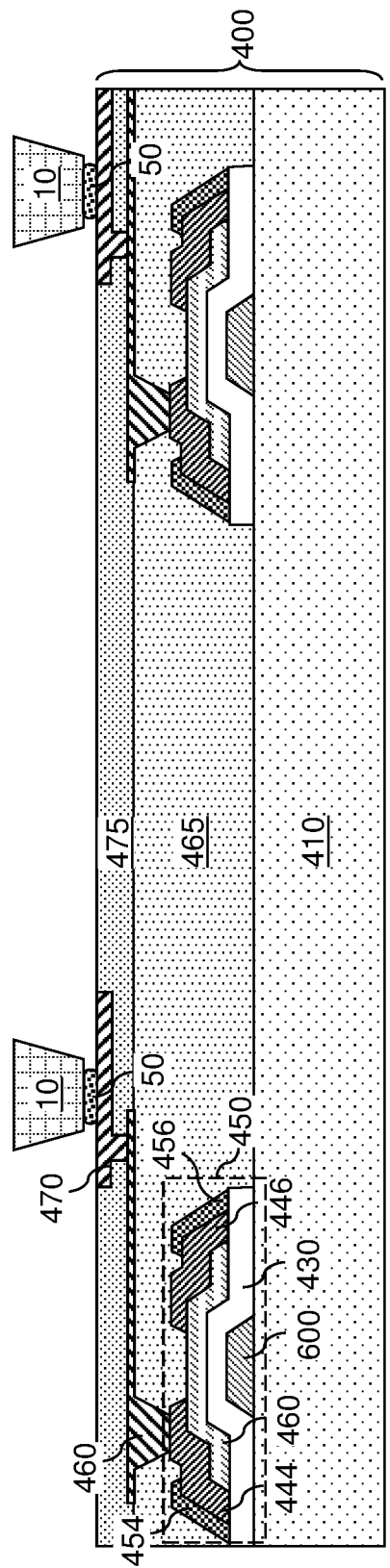
FIG. 1A is a vertical cross-sectional view of an exemplary structure after forming an array of light emitting diodes on a backplane according to an embodiment of the present disclosure.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a continuous portion of at least one material including a region having a thickness. A layer may consist of a single material portion having a homogeneous composition, or may include multiple material portions having different compositions.

As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "semiconducting material" refers to a material having electrical conductivity in the range from $1.0 \times 10^{-6}$ S/cm to $1.0 \times 10^5$ S/cm. As used herein, a "metallic material" refers to a conductive material including at least one metallic element therein. All measurements for electrical conductivities are made at the standard condition.

A display device, such as a direct view display can be formed from an ordered array of pixels. Each pixel can include a set of subpixels that emit light at a respective emission spectrum. For example, a pixel can include a red subpixel, a green subpixel, and a blue subpixel. Each subpixel can include one or more light emitting diodes that emit light of a particular peak wavelength, such as red light, green light or blue light. Alternatively, all light emitting diodes in each subpixel emit light of the same peak wavelength, such as blue light or ultraviolet (UV) radiation. A different color conversion medium, such as color converting quantum dots, phosphor or dye is located over each light emitting diode. For example, a red color conversion medium can be located over the blue or UV light emitting diode in the red subpixel, a green color conversion medium can be located over the blue or UV light emitting diode in the green subpixel, and a blue color conversion medium can be located over the blue or UV light emitting diode in the blue subpixel. Alternatively, the blue color conversion medium may be omitted if a blue light emitting diode is used in the blue subpixel. Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

According to an aspect of the present disclosure, one electrical node of each light emitting diode within an array of light emitting diodes that is attached to a backplane is electrically connected to a respective electrical node within the backplane through a bonding structure (such as a solder joint structure), and another electrical node of each light emitting device within the array of light emitting diodes is electrically connected to a respective electrical node within the backplane through an electrically conductive encapsulation layer which contacts at least a sidewall of each of the light emitting diodes. The electrically conductive encapsulation layer may comprise an optically transparent polymer material embedding conductive nanoparticles or nanowires. The electrically conductive encapsulation layer contacts at least the sidewalls of the light emitting diodes, and may be absent over the light emitting surface of the light emitting diodes. Use of an inorganic transparent conductive oxide material (such as indium tin oxide) covering the top (i.e., light emitting) surfaces of light emitting diodes can be avoided. Thus, coverage of the light-emitting side of the light emitting diodes can be minimized, and efficiency of light extraction can be enhanced though use of the structure and the methods of embodiments of the present disclosure.

Figure 1B:
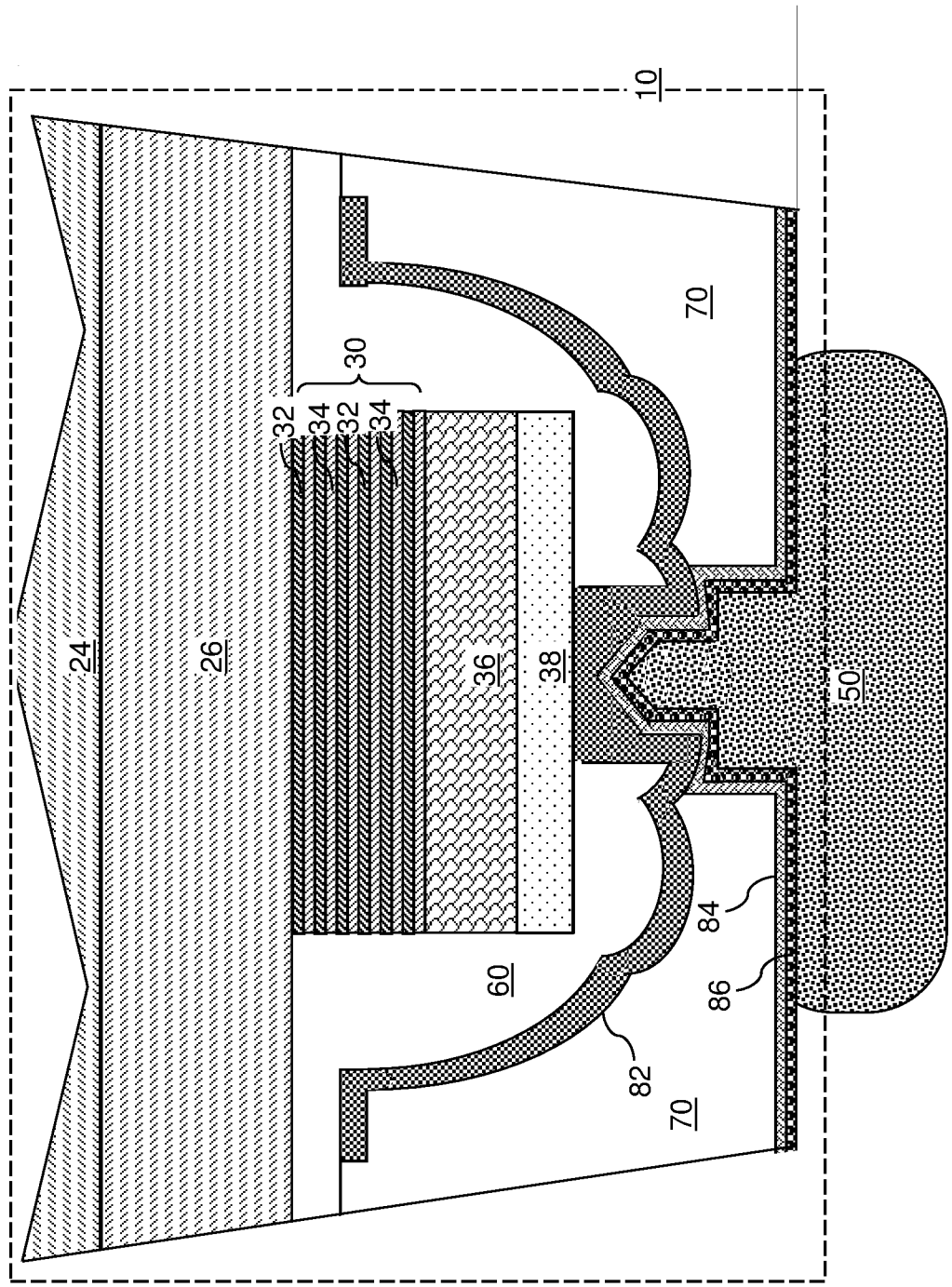
FIG. 1B is a magnified view of a region including a light emitting device within the exemplary structure of FIG. 1A.

Referring to FIGS. 1A and 1B, an exemplary structure according to a first embodiment of the present disclosure includes a backplane 400 and an array of light emitting diodes 10 attached to a front side of the backplane 400 through an array of solder contacts, such as solder layer or solder balls 50. The backplane 400 includes a backplane substrate 410, which can be an insulating substrate. A control circuitry for controlling operation of the light emitting diodes attached to the backplane 400 may be provided within the backplane. For example, switching devices 450 can be provided within the backplane 400. In an illustrative example, the switching devices 450 can include field effect transistors, such as thin film transistors (TFTs). In this case, each field effect transistor 450 may include a gate electrode 420, a gate dielectric 430, a channel region 442, a source region 446, and a drain region 444. While an inverted staggered TFT 450 is shown in FIG. 1, other types of TFTs, such as inverted coplanar, top gated staggered and top gated coplanar TFTs can be used instead. Other type of switching devices may also be used instead of or in addition to the TFTs 450. Various electrical wirings can be provided to interconnect the various electrical nodes of the field effect transistors to electrical interfaces (not expressly shown) on the backplane 400. A patterned passivation layer 454 may be optionally formed on the source regions 446 and the drain regions 444. Additional interconnect wiring may be provided as needed. The switching devices 450 can be encapsulated by an encapsulation dielectric layer 465. First-level metal interconnect structures 460 can be formed through the encapsulation dielectric layer 465 to a node of a respective switching device 450 such as a drain region 444. An interconnect level dielectric layer 475 may be formed over the encapsulation dielectric layer 465, and second-level metal interconnect structures 470 can be formed through the interconnect level dielectric layer 475 on the first-level metal interconnect structures 460. The second-level metal interconnect structures 470 can include an array of bonding pads for attaching the array of light emitting diodes 10.

Each light emitting diode 10 can be any diode configured to emit light along a direction away from the backplane 400 and having at least one bonding pad facing the backplane 400. While an exemplary configuration of the light emitting diodes 10 is illustrated in FIG. 1B, it is understood that other configurations for the light emitting diodes 10 can also be employed. A light emitting diode 10 may be formed by sequentially depositing a buffer layer 24 (such as a GaN layer and/or an AlGaN layer) and a first doped semiconductor layer 26 (such as an n-doped GaN layer) having a doping of a first conductivity type on any suitable substrate, such as a sapphire substrate. An active region 30 can be formed over the first doped semiconductor layer 26. In one embodiment, the active region 30 may comprise one or more quantum wells including multiple repetitions of a well semiconductor layer 32 (such as an InGaN layer) and barrier semiconductor layer 34 (such as GaN, AlGaN or InGaN having a lower indium concentration than the well semiconductor layer 32). In one embodiment, the active region 30 may include a superlattice of the well semiconductor layers 32 and the barrier semiconductor layers 34. Any layer stack that emits light as known in the art may be employed for the active region 30. For example, an active region 30 may include one or more InGaN/GaN quantum wells. A second doped semiconductor layer 36 having a doping of a second conductivity type can be formed on an opposite side of the active region 30. The second conductivity type is the opposite of the first conductivity type. In one embodiment, the second doped semiconductor layer 36 may comprise a p-type GaN layer.

An optional transparent conductive layer 38 (such as an indium tin oxide layer) can be deposited and patterned over the horizontally extending portion of the second conductivity type semiconductor layer 36. An optional dielectric material layer 60 may be deposited over the transparent conductive oxide layer 38 and the second conductivity type semiconductor layer 36. The dielectric material layer 60 includes a transparent dielectric material such as silicon oxide, silicon nitride, a dielectric metal oxide (such as aluminum oxide), organosilicate glass, or porous variants thereof. An opening can be formed through the dielectric material layer 60. A conductive reflector 82 can be formed on the transparent conducive layer 38 or on the second conductivity type semiconductor layer 36 by depositing a conductive reflective material layer in the opening through the dielectric material layer 60 and by patterning the conductive reflective material layer. For example, aluminum, silver, or gold may be employed for the conductive reflective material layer. An insulating cap layer 70 can be formed over the conductive reflector 82. An opening can be formed through the insulating cap layer 70 over the conductive reflector 82, and optional bonding pad layers (84, 86) can be formed in the openings and over the insulating cap layer 70. The bonding pad layers (84, 86) may include an electrically conductive diffusion barrier layer 84 (e.g., Ti, TiW, TiPt, or Ta), and an adhesion promoter layer 86 (e.g., W, Pt, or a W/Pt stack). The bonding pad layers (84, 86), the insulating cap layer 70, the dielectric material layer 60, the first doped semiconductor layer 26, and the buffer layer 24 can be patterned to form trenches that isolate each vertical stack of an active region 30 and a second doped semiconductor layer 36 from adjacent stacks of a respective active region 30 and a respective second doped semiconductor layer 36. Each contiguous combination of a patterned portion of bonding pad layers (84, 86), a patterned portion of the insulating cap layer 70, a conductive reflector 82, a patterned portion of the dielectric material layer 60, an optional transparent conductive layer 38, a second doped semiconductor layer 36, an active region 30, a patterned portion of the first doped semiconductor layer 26, and a patterned portion of the buffer layer 24 constitutes a light emitting diode 10.

In one embodiment, trenches can be formed through the bonding pad layers (84, 86), the insulating cap layer 70, the dielectric material layer 60, the doped semiconductor layer 26, and the buffer layer 24. If the trenches have a non-zero taper angle, the lateral dimension of the top surface of each patterned portion of the insulating cap layer 70 can be less than the lateral dimension of an underlying first doped semiconductor layer 26 within each light emitting diode 10. The taper angle may be in a range from 0.1 degree to 10 degrees, such as from 0.3 degree to 5 degrees.

Each light emitting diode 10 can comprise of respective bonding pad layers (84, 86), an insulating cap layer 70, a conductive reflector 82, a dielectric material layer 60, an optional transparent conductive layer 38, a second doped semiconductor layer 36, an active region 30, a first doped semiconductor layer 26, and a buffer layer 24. Solder balls 50 (or other bonding material) can be attached to each device-side bonding pad, which may comprise bonding pad layers (84, 86). The assembly of the substrate and an array of light emitting diodes 10 attached thereto can be flipped upside down, and is disposed over a backplane 400.

Portions of the buffer layer 24 that overlie attached light emitting diodes 10 are sequentially irradiated by a high power laser beam, such as an ultraviolet laser beam, through the substrate. Thus, each light emitting diode 10 can be detached from substrate by the laser irradiation (i.e., by laser lift-off). Each solder ball 50 on a light emitting diode 10 that needs to be attached to the backplane 400 can be reflowed so that an overlying light emitting diode 10 is bonded to the backplane 400. The reflow may be conducted by heating the solder balls by irradiating by an infrared laser beam through the backplane 400 or through the LEDs 10 onto the solder balls 50 or by annealing the device in a furnace or similar heating apparatus above the solder ball 50 melting temperature. If all the light emitting diodes 10 on the backplane emit the same peak radiation wavelength (e.g., UV or blue light), then all light emitting diodes are bonded to the backplane 400. If the light emitting diodes 10 on the backplane emit light of different wavelengths (e.g., red, green and blue) light, then only some of the light emitting diodes are removed from the substrate by laser lift-off and bonded to the backplane 400. In this case, the process is repeated twice more to bond the other color light emitting diodes 10 from different substrates to the backplane 400. An array of light emitting diodes 10 attached to a front side of the backplane 400 is provided as shown in FIGS. 1A and 1B.

Figure 2A:
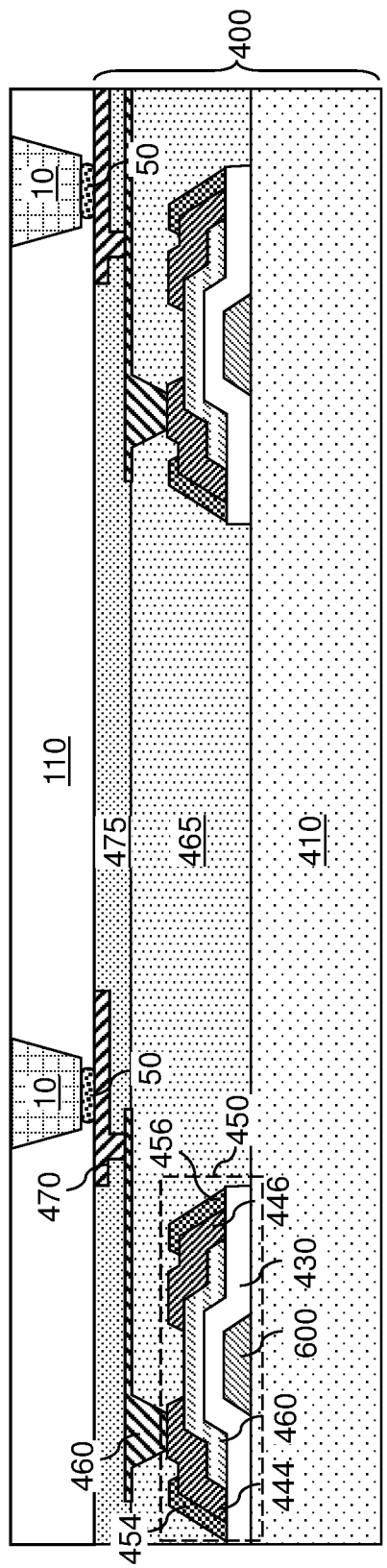
FIG. 2A is a vertical cross-sectional view of the exemplary structure after depositing and planarizing a dielectric matrix layer according to an embodiment of the present disclosure.
Figure 2B:
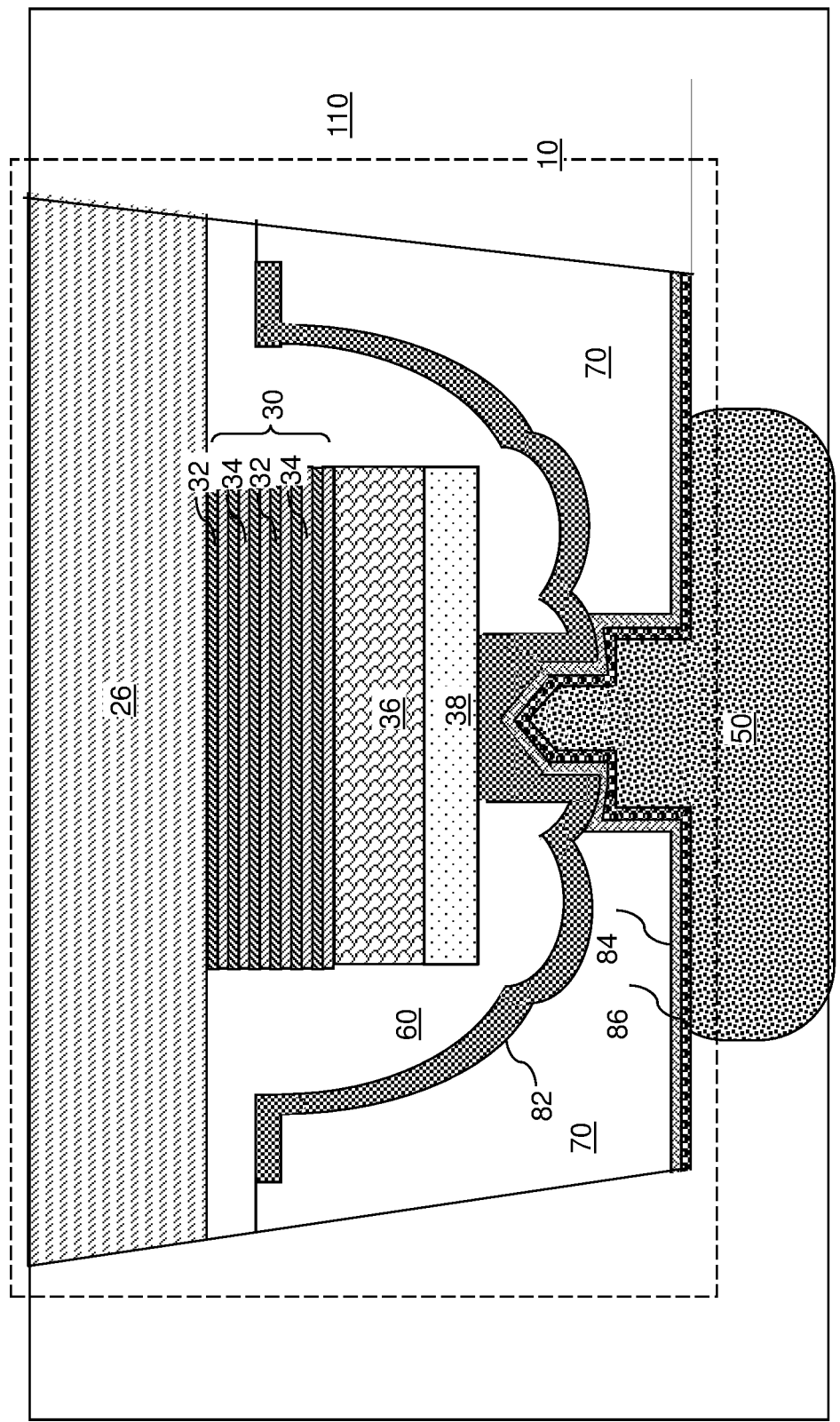
FIG. 2B is a magnified view of a region including a light emitting device within the exemplary structure of FIG. 2A.

Referring to FIGS. 2A and 2B, a planarizable dielectric material layer is deposited over the backplane 400 between the array of light emitting diodes 10. The planarizable dielectric material layer can be a silicon oxide-based material such as undoped silicate glass, a doped silicate glass (such as borosilicate glass, phosphosilicate glass, or borophosphosilicate glass), or a flowable oxide (FOX)), silicone, or an organic material such as resin. The planarizable dielectric material can be deposited by spin coating or chemical vapor deposition (such as sub-atmospheric chemical vapor deposition, plasma enhanced chemical vapor deposition, roller coating, blade coating, or dipping in a solution bath).

The planarizable dielectric material is either self-planarized if deposited by spin coating or can be subsequently planarized, for example, by chemical mechanical planarization (CMP). The remaining continuous portion of the planarizable dielectric material layer is herein referred to as a dielectric matrix layer 110. The dielectric matrix layer 110 can be formed on the front side of the backplane 400 and around the array of light emitting diodes 10. The dielectric matrix layer 110 embeds the array of light emitting diodes 10. The top surface of the dielectric matrix layer 110 can be coplanar with the top surfaces of the light emitting diodes 10. The dielectric matrix layer 110 is located on the front side of the backplane 400, and laterally surrounds the array of light emitting diodes 10.

Figure 3A:
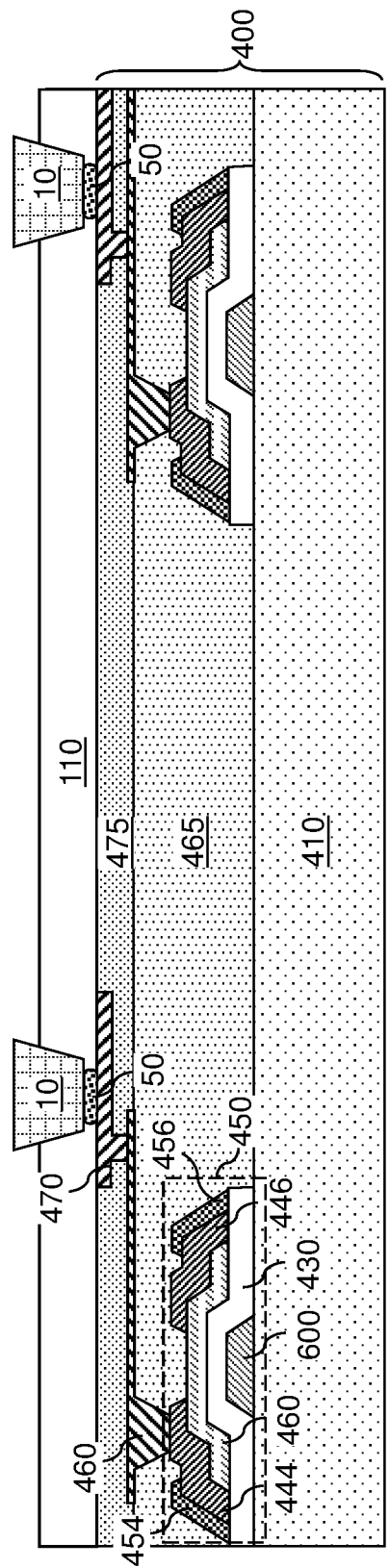
FIG. 3A is a vertical cross-sectional view of the exemplary structure after vertically recessing the dielectric matrix layer according to an embodiment of the present disclosure.
Figure 3B:
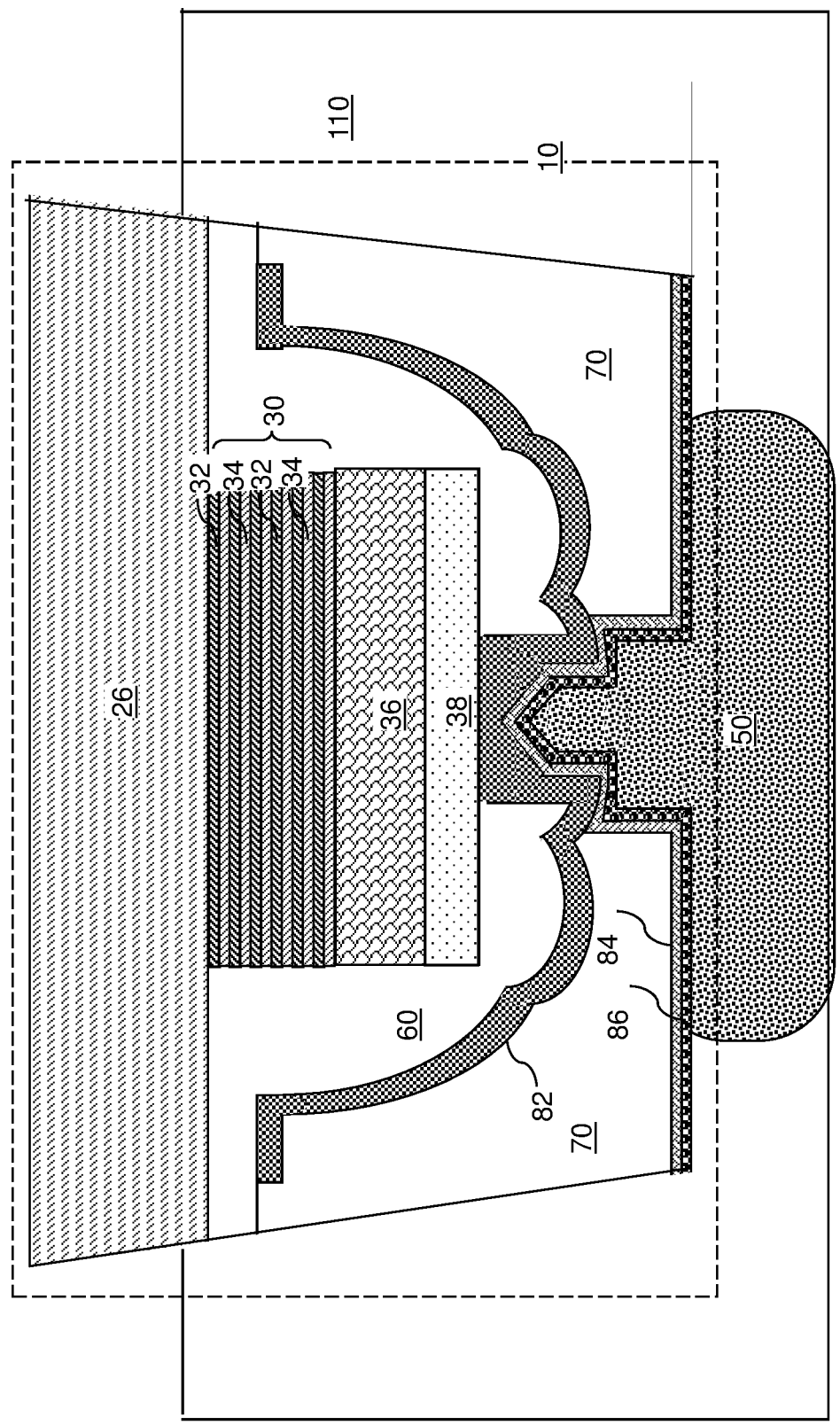
FIG. 3B is a magnified view of a region including a light emitting device within the exemplary structure of FIG. 3A.
Figure 3C:
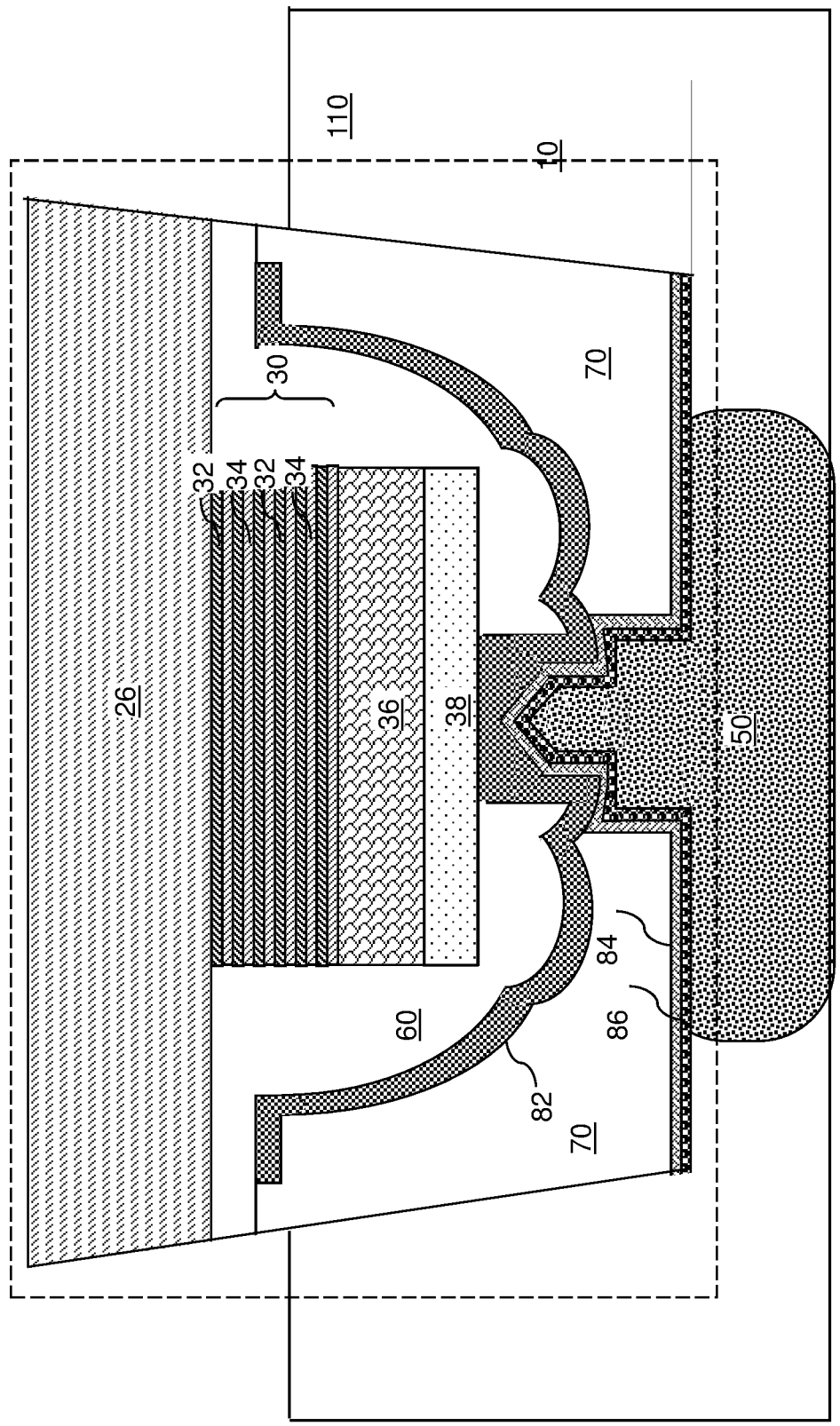
FIG. 3C is a magnified view of a region including a light emitting device within an alternative embodiment of the exemplary structure of FIG. 3A.

Referring to FIGS. 3A-3C, the top surface of the dielectric matrix layer 110 can be vertically recessed by performing an etch process that etches the dielectric material of the dielectric matrix layer 110 selective to the material of the first doped semiconductor layers 26 of the light emitting diodes 10. The etch process may comprise an isotropic etch process such as a wet etch process or an anisotropic etch process such as a reactive ion etch process. For example, if the dielectric matrix layer 110 comprises silicon oxide, a wet etch process employing hydrofluoric acid can be performed to vertically recess the top surface of the dielectric matrix layer 110.

In one embodiment, the vertical recess distance of the top surface of the dielectric matrix layer 110 may be less than the thickness of the first doped semiconductor layers 26, as illustrated in FIG. 3B. In this case, an upper segment of each sidewall of the first doped semiconductor layers 26 can be physically exposed, and a lower segment of each sidewall of the first doped semiconductor layers 26 can be in direct contact with the dielectric matrix layer 110 after vertical recessing of the top surface of the dielectric matrix layer 110. In this embodiment, the insulating layers 60 and 70 may be omitted, and the reflector 82 may be located only under the second conductivity type semiconductor layer 36.

In another embodiment in which the insulating layers 60 and/or 70 are present, the vertical recess distance of the top surface of the dielectric matrix layer 110 may be greater than the thickness of the first doped semiconductor layers 26, as illustrated in FIG. 3C. In this case, the entirety of each sidewall of the first doped semiconductor layers 26 can be physically exposed after vertical recessing of the top surface of the dielectric matrix layer 110. The thickness of each of the first doped semiconductor layers 26 may be in a range from 100 nm to 3 microns, such as from 300 nm to 1 micron, although lesser and greater thicknesses may also be employed.

In another embodiment, the dielectric matrix layer 110 vertical recessing step shown in FIGS. 3A-3C may be omitted. In this embodiment, the dielectric matrix layer 110 is formed by spin coating or a similar self-planarizing method at the step shown in FIGS. 2A-2C to a height below the top surface of the first doped semiconductor layers 26. Thus, the structure shown in FIGS. 3A-3B may be formed in one step instead of two separate steps.

Referring to FIGS. 4A-4D, an electrically conductive encapsulation layer 120 is formed in contact with the sidewalls of the first doped semiconductor layers 26 of the light emitting diodes 10. In one embodiment, the conductive encapsulation layer 120 contacts the sidewalls of the first doped semiconductor layers 26, but does not contact the top (i.e., light emitting) surface of the light emitting diodes 10 (i.e., does not contact the top surface of the first doped semiconductor layers 26).

The conductive encapsulation layer 120 may comprise any electrically conductive encapsulation material, such as an electrically conductive organic material, such as an electrically conductive polymer material or an electrically insulating polymer matrix material containing conductive nanostructures in excess of the percolation threshold to render the composite polymer matrix and nanostructure composite electrically conductive. The nanostructures may comprise nanowires and/or nanoparticles. The polymer material may be deposited as a monomer solution or suspension over the dielectric matrix layer 110 located over the backplane 400 followed by polymerization in contact with the light emitting diodes 10. Alternatively, the polymer material may be deposited over the dielectric matrix layer 110 located over backplane 400 as a polymer solution or suspension followed by removal of the solvent.

In one embodiment, a suspension including monomer units for formation of a polymer material and conductive nanostructures (e.g., nanoparticles and/or nanowires) is deposited over the dielectric matrix layer 110. The monomer units may comprise any units of a monomer that can be subsequently polymerized to form an optically transparent polymer material. In other words, the monomer units may comprise units of a monomer that can be subsequently polymerized to form a polymer. The polymer may comprise a transparent polymer material which has a transparency of at least 70% in a wavelength range of 400 nm to 700 nm. Alternatively, if the polymer is not formed over the light-emitting surfaces of the light emitting diodes 10, then the polymer may have a transparency of less than 70% in the wavelength range of 400 nm to 700 nm, and may be optically opaque in this wavelength range.

The monomer units may comprise units of a polymer material, such as a polycarbonate polymer, a polymethyl methacrylate polymer, an acrylic polymer, a polyethylene terephthalate polymer, a polyethylene terephthalate glycol polymer, a polyvinyl chloride polymer, a silicone-based polymer, a cyclic olefin copolymer, a polyethylene polymer, a ionomer resin, a transparent polypropylene polymer, a fluorinated ethylene propylene polymer, a styrene methyl methacrylate polymer, a styrene acrylonitrile resin polymer, a polystyrene polymer, or a methyl methacrylate acrylonitrile butadiene styrene polymer. The suspension may comprise a suitable solvent that provides sufficient viscosity to the units of the monomer, i.e., monomer molecules, prior to a polymerization process to be subsequently performed. The solvent may be selected based on the species of the monomer molecules as known in the art.

As used herein, nanostructures have at least one dimensional that is less than 1 micron, such as 1 to 100 microns. As used herein, nanoparticles refer to particles having nanoscale dimensions for the length and the width, i.e. having a diameter that is less than 1 micron for spherical nanoparticles, or length that is less than 1 micron and having a width less than 1 micron for non-spherical nanoparticles. In some embodiments, nanoparticles may have a diameter in a range from 1 nm to 100 nm. As used herein, nanowires refer to a nanostructure having a length-to-width ratio that is greater than 10, such as a ratio in a range from 10 to $1.0 \times 10^6$, and having a width that is less than 1 micron, such as a width in a range from 1 nm to 100 nm.

In one embodiment, the nanostructures (e.g., nanoparticles or the nanowires) comprise metal or metal alloy nanostructures, such as silver, gold, platinum, copper, aluminum, etc., nanostructures. In one embodiment, the nanostructures comprise silver nanowires consisting essentially of silver. In one embodiment, a silver nanowire ink including silver nanowires and monomer units may be employed. In this case, the silver nanowires comprise elongated structures with a respective diameter in a range from 1 nm to 100 nm. The silver nanowires having a length-to-width ratio greater than 100. The silver nanowire ink contains above a percolation threshold of the silver nanowires (e.g., at least 15 weight percent or at least 0.5 volume percent silver nanowires as measured in the final conductive encapsulation layer 120) and is highly electrically conductive. Alternatively, the conductive nanostructures may comprise conductive carbon nanotubes, such as single walled and/or multi-walled carbon nanotubes.

In another embodiment, the conductive encapsulation layer 120 comprises an electrically conductive polymer (i.e., an intrinsically conducting polymer) layer which lacks conductive nanostructures. The electrically conductive polymer may comprise at least one of poly(pyrrole)s (PPY), polyanilines (PANI), Poly(acetylene)s (PAC), Poly(p-phenylene vinylene) (PPV), poly(thiophene)s (PT), poly(3,4-ethylenedioxythiophene) (PEDOT), or poly(p-phenylene sulfide) (PPS).

The suspension including the monomer units for formation of the polymer material and the conductive nanostructures can be applied over the recessed horizontal top surface of the dielectric matrix layer 110 around the protruding portions of the light emitting diodes 10, for example, by a self-planarizing deposition process, such as a spin-coating process. A polymerization step, a thermal polymerization and/or a UV polymerization step can be performed to polymerize the monomer molecules within the suspension and to induce formation of a polymer matrix embedding the conductive nanostructures. The polymer matrix that embeds the conductive nanoparticles or the conductive nanowires constitutes the conductive encapsulation layer 120. If the conductive encapsulation layer 120 is deposited as a polymer layer, then the polymerization step may be omitted. A curing process may be performed to volatilize the solvent of the suspension, thereby removing the solvent from the conductive encapsulation layer 120.

In one embodiment, the top surface of the conductive encapsulation layer 120, as formed after the polymerization process and the curing process, may be formed at or below the horizontal plane including top surfaces of the light emitting diodes 10 (e.g., the top surfaces of the first doped semiconductor layers 26). Thus, the top surface of the light emitting diodes 10 are preferably not covered by the conductive encapsulation layer 120.

Figure 4A:
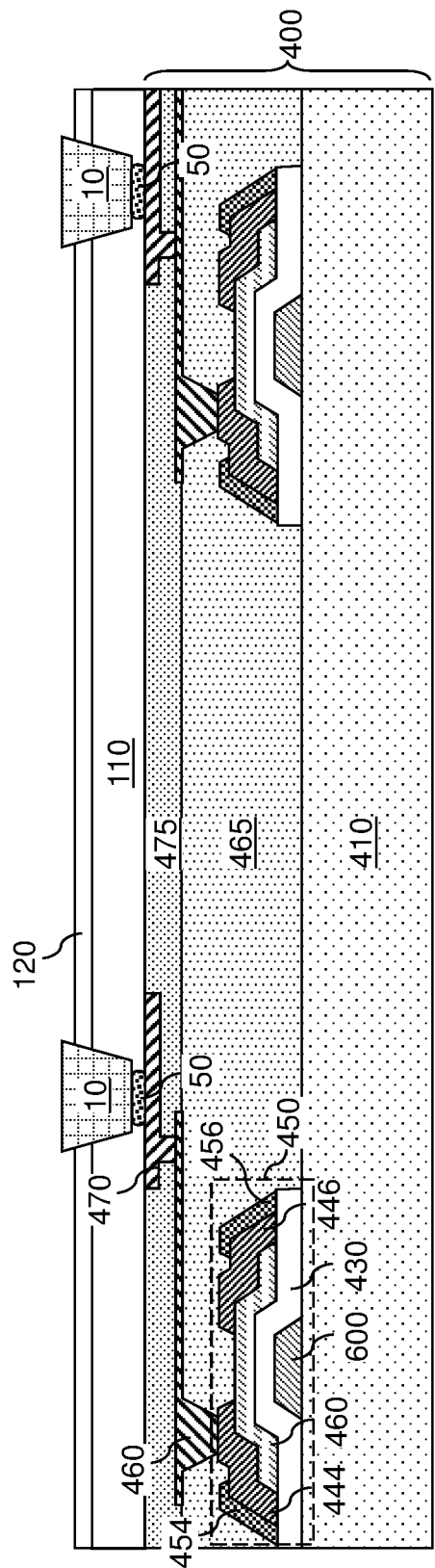
FIG. 4A is a vertical cross-sectional view of the exemplary structure after formation of a conductive encapsulation layer according to an embodiment of the present disclosure.
Figure 4B:
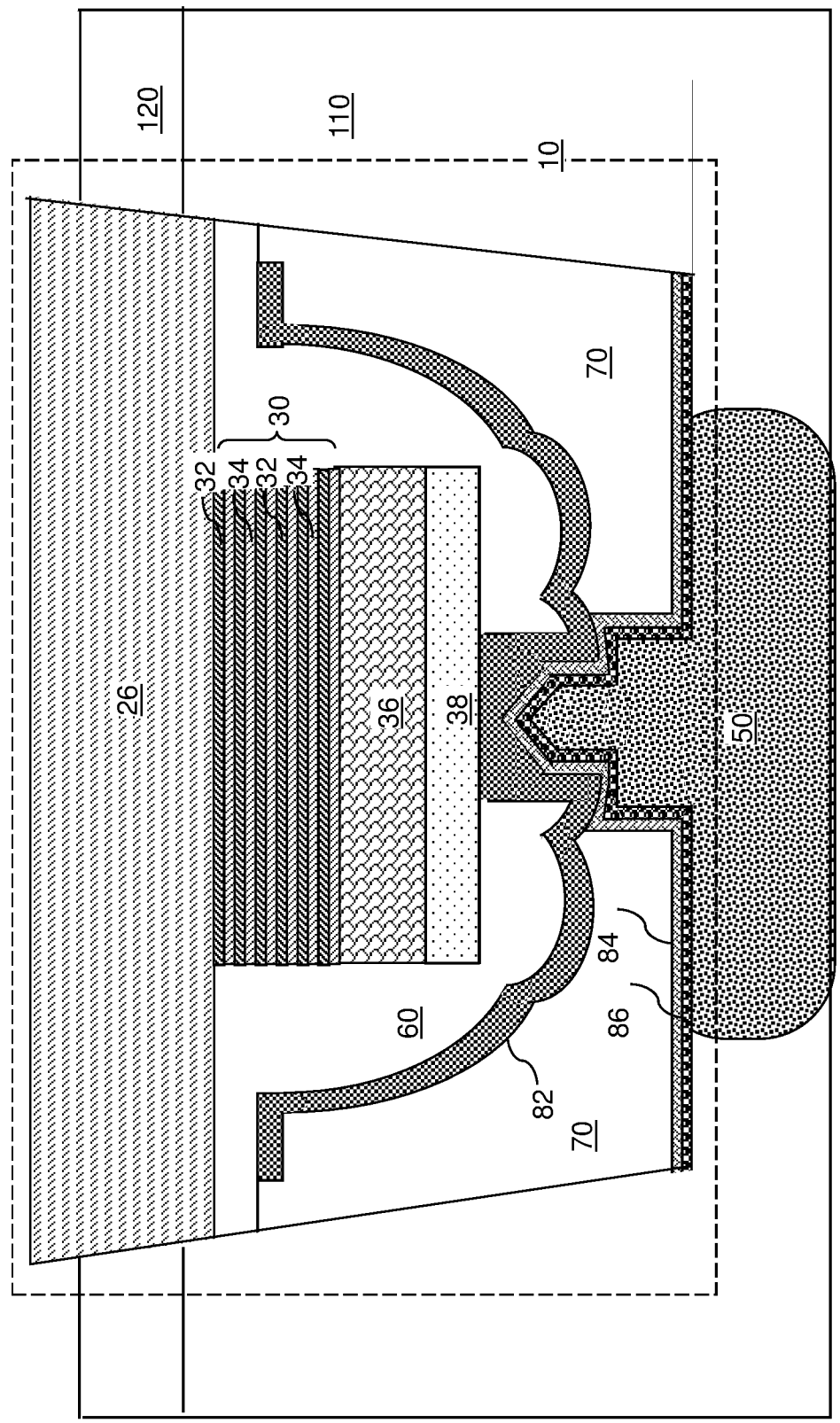
FIG. 4B is a magnified view of a region including a light emitting device within the exemplary structure of FIG. 4A.

In one embodiment shown in FIG. 4B, the top surface of the conductive encapsulation layer 120 is located below the top surfaces of the light emitting diodes 10, and the horizontal interface between the conductive encapsulation layer 120 and the dielectric matrix layer 110 may be formed above the horizontal plane including the interfaces between the first doped semiconductor layers 26 and the active regions 30. In this case, a bottom segment of each sidewall of the first doped semiconductor layers 26 may contact the dielectric matrix layer 110, a middle segment of each sidewall of the first doped semiconductor layer 26 may contact the conductive encapsulation layer 120, and a top segment of each sidewall of the first doped semiconductor layers 26 may be physically exposed. The top surface of each first doped semiconductor layer 26 can be physically exposed, i.e., not covered by the conductive encapsulation layer 120.

Figure 4C:
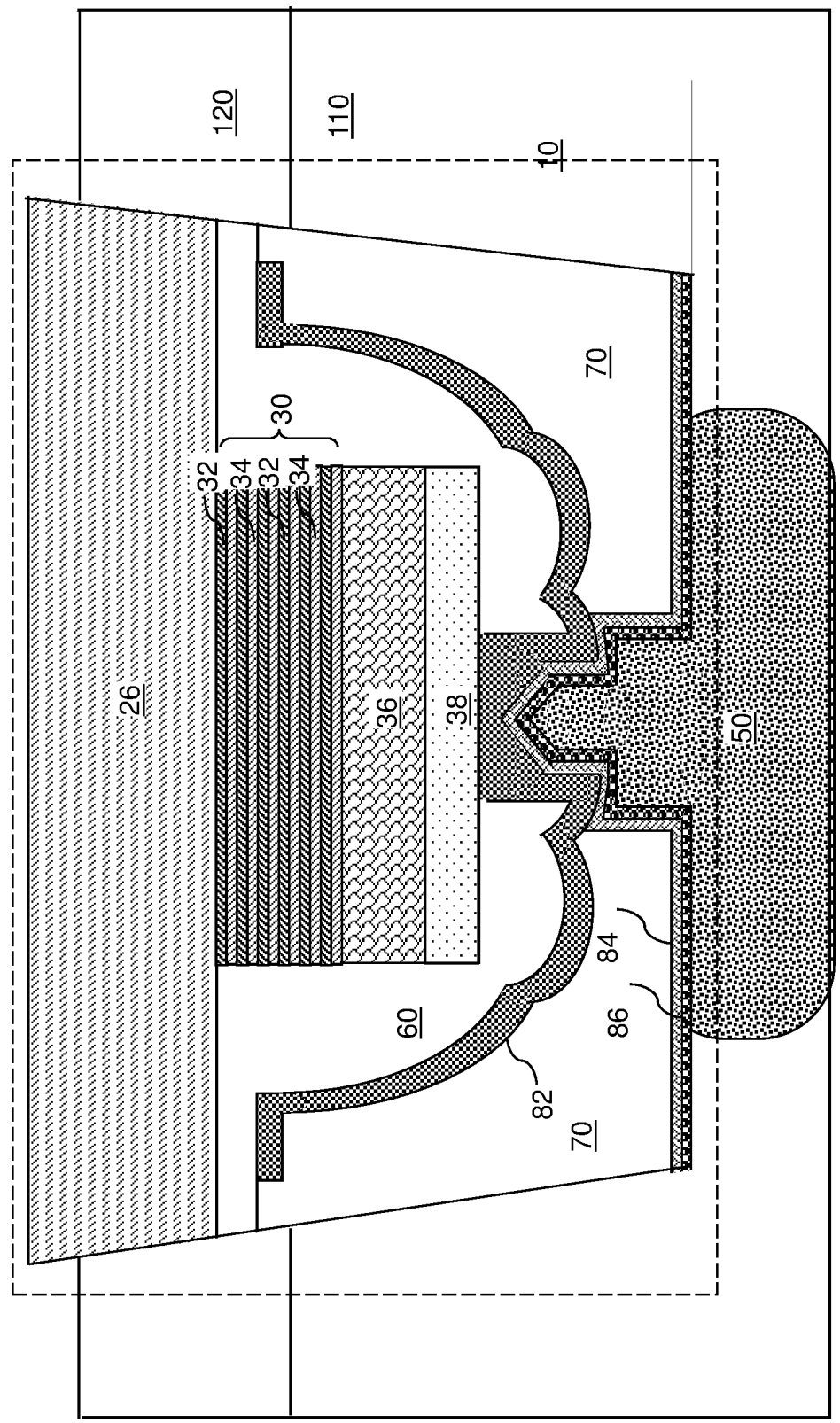
FIG. 4C is a magnified view of a region including a light emitting device within an alternative embodiment of the exemplary structure of FIG. 4A.

Alternatively, as shown in FIG. 4C, the horizontal interface between the conductive encapsulation layer 120 and the dielectric matrix layer 110 may be formed below the horizontal plane including the interfaces between the first doped semiconductor layers 26 and the active regions 30. In this case, a bottom segment of each sidewall of the first doped semiconductor layers 26 may contact the conductive encapsulation layer 120, and a top segment of each sidewall of the first doped semiconductor layers 26 may be physically exposed, i.e., not covered by the conductive encapsulation layer 120.

Figure 4D:
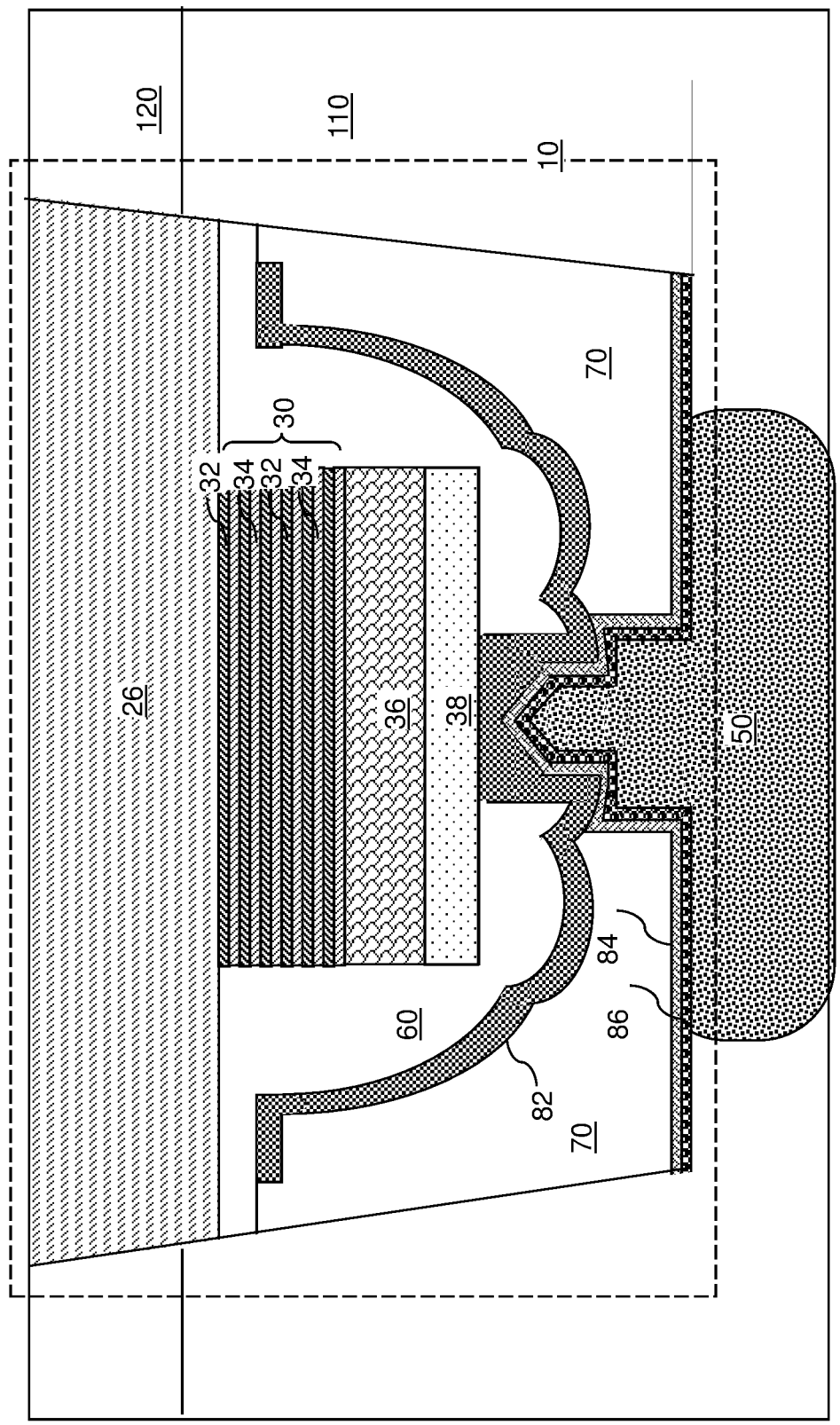
FIG. 4D is a magnified view of a region including a light emitting device within an alternative embodiment of the exemplary structure of FIG. 4A.

In another embodiment shown in FIG. 4D, the conductive encapsulation layer 120 may be planarized after deposition (e.g., after the polymerization and/or curing processes), or the amount of the applied solvent may be controlled such that the top surface of the conductive encapsulation layer 120 is formed within the horizontal plane including the top surfaces of the first doped semiconductor layers 126 of the light emitting diodes 10. The entirety of each sidewall of the first doped semiconductor layers 26 may contact the conductive encapsulation layer 120, or may contact the combination of the conductive encapsulation layer 120 and the dielectric matrix layer 110. The top surface of each first doped semiconductor layer 26 can be physically exposed, i.e., not covered by the conductive encapsulation layer 120.

The thickness of the conductive encapsulation layer 120 may be in a range from 100 nm to 3 microns, such as from 300 nm to 1 micron. The thickness of the conductive encapsulation layer 120 may be greater than, the same as, or less than, the thickness of the first doped semiconductor layers 26.

If the conductive encapsulation layer 120 includes the conductive nanostructures, then these conductive nanostructures contact one another and form a highly conductive network within the conductive encapsulation layer 120. The amount of the conductive nanostructures in the conductive encapsulation layer 120 is above the percolation threshold (e.g., above about 0.5 volume percent and/or above about 15 weight percent). Thus, the network of the conductive nanostructures embedded in the conductive encapsulation layer 120 forms a conductive structure that provides electrical contact to each of the first doped semiconductor layers 26 of the light emitting diodes 10. The network of the conductive nanoparticles or the conductive nanowires embedded in the conductive encapsulation layer 120 can function as common electrical ground, and can be electrically connected to the electrical ground within the backplane 400 through conductive via structures (not illustrated) that vertically extend through the dielectric matrix layer 110. Generally, each of the first doped semiconductor layers 26 in the light emitting diodes 10 can be electrically connected to a respective first node within the backplane 400 (which may be electrical ground), and each of the second doped semiconductor layers 36 in the light emitting diodes 10 can be electrically connected to a respective second node within the backplane 400 (which can be control electrodes for turning on or turning off a respective light emitting diode 10).

In one embodiment, the conductive encapsulation layer 120 includes conductive nanostructures embedded in a polymer matrix that comprises and/or consists essentially of an insulating polymer material selected from a polycarbonate polymer, a polymethyl methacrylate polymer, an acrylic polymer, a polyethylene terephthalate polymer, a polyethylene terephthalate glycol polymer, a polyvinyl chloride polymer, a silicone-based polymer, a cyclic olefin copolymer, a polyethylene polymer, a ionomer resin, a transparent polypropylene polymer, a fluorinated ethylene propylene polymer, a styrene methyl methacrylate polymer, a styrene acrylonitrile resin polymer, a polystyrene polymer, or a methyl methacrylate acrylonitrile butadiene styrene polymer. In another embodiment the conductive encapsulation layer 120 comprises and/or consists essentially of a conductive polymer material selected from at least one of poly (pyrrole)s (PPY), polyanilines (PANI), Poly(acetylene)s (PAC), Poly(p-phenylene vinylene) (PPV), poly(thiophene)s (PT), poly(3,4-ethylenedioxythiophene) (PEDOT), or poly (p-phenylene sulfide) (PPS).

In one embodiment, the dielectric matrix layer 110 can be located on the front side of the backplane 400, and can laterally surround the array of light emitting diodes 10. A horizontal bottom surface of the conductive encapsulation layer 120 contacts a horizontal top surface of the dielectric matrix layer 110.

In one embodiment, the conductive encapsulation layer 120 is not in directly contact with top surfaces of the light emitting diodes 10 within the array of light emitting diodes 10. In one embodiment, the conductive encapsulation layer 120 comprises a topmost surface that is more proximal to the backplane 400 than topmost surfaces of the array of light emitting diodes 10, and comprises at least as many openings therethrough as the total number of light emitting diodes 10 within the array of light emitting diodes 10.

In one embodiment, each of the light emitting diodes 10 comprises a conductive reflector 82 configured to reflect light emitted from a respective active region 30 toward a respective first doped semiconductor layer 26 and electrically connected to a respective doped semiconductor layer 36, for example, through a respective transparent conductive layer 38 or by direct contact with the respective doped semiconductor layer 36.

The various configurations of the present disclosure provide improved electrical contact between conductive encapsulation layer 120 with a sidewall of the first doped semiconductor layers 26 in each light emitting diode 10, while preventing contact with the active regions 30, the second doped semiconductor layers 36 or the conductive reflectors 82. In one embodiment, the conductive encapsulation layer 120 does not overlie the top (i.e., light-emitting) surface of the light emitting diodes 10, improving transmittance of light from the light emitting diodes 10. Furthermore, by omitting formation of top transparent conductive oxide layer (e.g., indium tin oxide), the process is simplified and the process cost is reduced. Finally, the driving voltage may be reduced and light emitting diode efficiency may be increased due to the good sidewall electrical contact with the conductive encapsulation layer 120.

Figure 5:
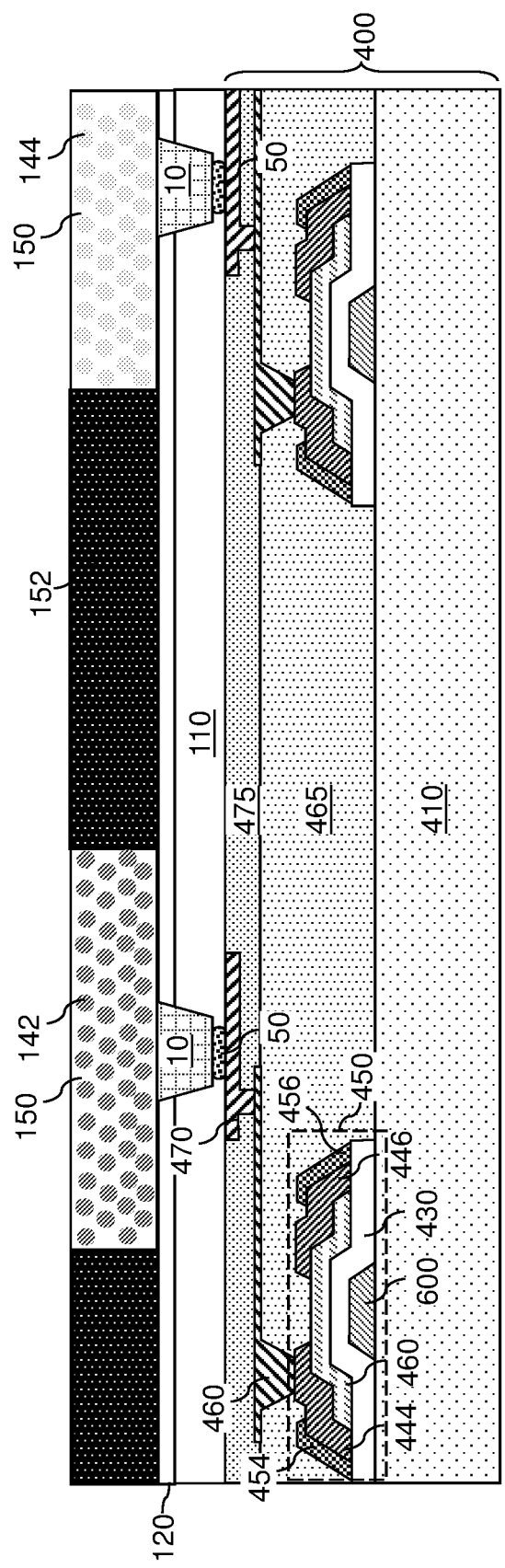
FIG. 5 is a vertical cross-sectional view of the exemplary structure after forming a color conversion medium on a front side of the array of light emitting diodes according to an embodiment of the present disclosure.

If all light emitting diodes 10 located on the backplane 400 emit radiation of the same peak wavelength (e.g., blue or UV wavelength), then a different color conversion medium, such as color converting quantum dots, phosphor or dye is located over each light emitting diode 10 in each subpixel. Referring to FIG. 5, red light emitting quantum dots 142 are located over a first light emitting diode 10, green light emitting quantum dots 144 are located over a second light emitting diode 10 in a green subpixel, and optionally blue light emitting quantum dots (not shown for clarity) are located over a third light emitting diode in a blue subpixel. The quantum dots may be embedded in an optically transparent polymer matrix 150 if desired. Optically opaque or reflective separators 152 may be located between polymer matrix 150 of each subpixel. The polymer matrix 150 may be electrically insulating or electrically conducting (i.e., it may contain conductive nanostructures or comprise an electrically conductive polymer), similar to the material of the conductive encapsulation layer 120.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light emitting device, comprising:
a backplane;
an array of light emitting diodes attached to a front side of the backplane, wherein each of the array of light emitting diodes comprises a stack of a first doped semiconductor layer, a second doped semiconductor layer, and an active region located between the first and the second doped semiconductor layers; and
a conductive encapsulation layer in contact with sidewalls of the first doped semiconductor layers of the array of light emitting diodes,
wherein the conductive encapsulation layer comprises a polymer material, and
wherein the polymer material comprises an insulating polymer matrix, and the conductive encapsulation layer comprises conductive nanostructures.

2. The light emitting device of claim 1, wherein the conductive nanostructures having at least one dimension which is less than 1 micron embedded in the insulating polymer matrix.

3. The light emitting device of claim 1, wherein the conductive nanostructures comprise electrically conductive nanoparticles or nanowires.

4. The light emitting device of claim 1, wherein the conductive nanostructures comprise electrically conductive nanowires having an average length-to-width ratio in a range from 10 to $1.0 \times 10^6$.

5. The light emitting device of claim 4, wherein the electrically conductive nanowires comprise silver nanowires.

6. The light emitting device of claim 1, wherein the conductive nanostructures comprise carbon nanotubes.

7. The light emitting device of claim 1, wherein an amount of the conductive nanostructures in the conductive encapsulation layer is above a percolation threshold.

8. The light emitting device of claim 1, wherein the insulating polymer matrix comprises a material selected from a polycarbonate polymer, a polymethyl methacrylate polymer, an acrylic polymer, a polyethylene terephthalate polymer, a polyethylene terephthalate glycol polymer, a polyvinyl chloride polymer, a silicone-based polymer, a cyclic olefin copolymer, a polyethylene polymer, a ionomer resin, a transparent polypropylene polymer, a fluorinated ethylene propylene polymer, a styrene methyl methacrylate polymer, a styrene acrylonitrile resin polymer, a polystyrene polymer, or a methyl methacrylate acrylonitrile butadiene styrene polymer.

9. The light emitting device of claim 1, wherein the polymer material comprises an electrically conductive polymer material.

10. The light emitting device of claim 1, further comprising a dielectric matrix layer located on the front side of the backplane and laterally surrounding the array of light emitting diodes, wherein a horizontal bottom surface of the conductive encapsulation layer contacts a horizontal top surface of the dielectric matrix layer.

11. The light emitting device of claim 1, wherein the conductive encapsulation layer is not in direct contact with top surfaces of the array of light emitting diodes within the array of light emitting diodes.

12. The light emitting device of claim 1, wherein the conductive encapsulation layer comprises a topmost surface that is more proximal to the backplane than topmost surfaces of the array of light emitting diodes.

13. The light emitting device of claim 1, wherein each of the array of light emitting diodes comprises a conductive reflector configured to reflect light emitted from a respective active region toward a respective first doped semiconductor layer, and electrically connected to a respective doped semiconductor layer.

14. The light emitting device of claim 1, wherein the light emitting device comprises a direct view display device.

15. A method of forming a light emitting device, the method comprising:
attaching an array of light emitting diodes to a front side of a backplane;
forming a dielectric matrix layer on the front side of the backplane and around the array of light emitting diodes, wherein sidewalls of light emitting diodes within the array of light emitting diodes are physically exposed; and
forming a conductive encapsulation layer over the dielectric matrix layer and directly on sidewalls of the array of light emitting diodes within the array of light emitting diodes,
wherein the conductive encapsulation layer comprises a polymer material, and
wherein the polymer material comprises an insulating polymer matrix, and the conductive encapsulation layer comprises conductive nanostructures.

16. The method of claim 15, wherein:
each of the light emitting diodes comprises a stack of a first doped semiconductor layer, a second doped semiconductor layer, and an active region located between the first and the second doped semiconductor layers; and
the conductive encapsulation layer is formed directly on sidewalls of the first doped semiconductor layer.

17. The method of claim 15, wherein:
the conductive nanostructures having at least one dimension which is less than 1 micron embedded in the insulating polymer matrix; and
forming the conductive encapsulation layer comprises spin coating a suspension comprising monomer units and the conductive nanostructures over the dielectric matrix layer below a top surface of the array of light emitting diodes followed by polymerizing the monomer units.

18. The method of claim 15, wherein an amount of the conductive nanostructures in the conductive encapsulation layer is above a percolation threshold.

19. The method of claim 15, wherein the conductive encapsulation layer comprises an electrically conductive polymer material.

20. A method of forming a light emitting device, comprising:
attaching an array of light emitting diodes to a front side of a backplane;
forming a dielectric matrix layer on the front side of the backplane and around the array of light emitting diodes, wherein sidewalls of light emitting diodes within the array of light emitting diodes are physically exposed; and forming a conductive encapsulation layer over the dielectric matrix layer and directly on sidewalls of the array of light emitting diodes within the array of light emitting diodes, wherein the conductive encapsulation layer comprises conductive nanostructures having at least one dimension which is less than 1 micron embedded in an insulating polymer matrix; and wherein forming the conductive encapsulation layer comprises spin coating a suspension comprising monomer units and the conductive nanostructures over the dielectric matrix layer below a top surface of the array of light emitting diodes followed by polymerizing the monomer units.

* * * * *